(12) United States Patent
Venkataramani et al.

(10) Patent No.: US 7,564,931 B2
(45) Date of Patent: Jul. 21, 2009

(54) ROBUST MAXIMUM-LIKELIHOOD BASED TIMING RECOVERY

(75) Inventors: Raman Venkataramani, Pittsburgh, PA (US); Mehmet Fatih Erden, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 589 days.

(21) Appl. No.: 11/125,436

(22) Filed: May 10, 2005

(65) Prior Publication Data

US 2006/0256896 A1 Nov. 16, 2006

(51) Int. Cl.
*H04L 27/06* (2006.01)
(52) U.S. Cl. ............... 375/341; 375/355; 375/316; 375/375; 342/195; 360/39; 360/51; 708/444
(58) Field of Classification Search ............... 375/341, 375/354, 316, 355; 342/195; 360/39, 51; 708/444; 369/59.22
See application file for complete search history.

(56) References Cited

U.S. PATENT DOCUMENTS

| | | | | |
|---|---|---|---|---|
| 5,341,249 | A | * | 8/1994 | Abbott et al. ............... 360/46 |
| 5,416,806 | A | * | 5/1995 | Coker et al. ............... 375/354 |
| 5,495,256 | A | * | 2/1996 | Piper ............... 342/195 |
| 5,726,818 | A | | 3/1998 | Reed et al. |
| 5,771,127 | A | | 6/1998 | Reed et al. |
| 6,009,549 | A | | 12/1999 | Bliss et al. |
| 6,108,151 | A | | 8/2000 | Tuttle et al. |
| 6,151,179 | A | * | 11/2000 | Poss ............... 360/46 |
| 6,324,225 | B1 | | 11/2001 | Brianti et al. |
| 7,035,029 | B2 | * | 4/2006 | Sawada et al. ............... 360/51 |
| 7,113,555 | B2 | * | 9/2006 | Campello de Souza et al. .. 375/341 |
| 7,155,470 | B2 | * | 12/2006 | Serizawa ............... 708/444 |
| 7,274,645 | B2 | * | 9/2007 | Urita ............... 369/59.22 |
| 7,369,626 | B1 | * | 5/2008 | Chiodini et al. ............... 375/316 |
| 2002/0067781 | A1 | | 6/2002 | Brianti et al. |
| 2002/0085650 | A1 | | 7/2002 | Brianti et al. |
| 2002/0126749 | A1 | | 9/2002 | Galbraith et al. |
| 2003/0072099 | A1 | | 4/2003 | Annampedu |
| 2003/0128451 | A1 | | 7/2003 | Ohta et al. |
| 2003/0185331 | A1 | | 10/2003 | Agizim et al. |
| 2004/0030948 | A1 | | 2/2004 | Yamazaki et al. |
| 2004/0070432 | A1 | | 4/2004 | Chauhan |
| 2004/0071232 | A1 | * | 4/2004 | de Souza et al. ............... 375/341 |
| 2004/0091069 | A1 | | 5/2004 | Liu et al. |
| 2004/0196941 | A1 | | 10/2004 | Hsu |

(Continued)

OTHER PUBLICATIONS

Sandell et al. (ML Estimation of Time and Frequency Offset in OFDM Systems; IEEE Transactions on Signal Processing; vol. 45, No. 7; pp. 1800-1805; Jul. 1997).*

(Continued)

*Primary Examiner*—Sudhanshu C Pathak
(74) *Attorney, Agent, or Firm*—Robert P. Lenart, Esq.; Pietragallo Gordon Alfano Bosick & Raspanti, LLP

(57) ABSTRACT

A method of timing recovery comprises receiving an input signal, sampling the input signal to produce a plurality of signal samples, detecting the samples to produce an output signal, and controlling timing of the sampling in response to a maximum-likelihood estimation of timing error between an actual sampling time instant and a desired sampling time instant. Apparatus that performs the method is also provided.

16 Claims, 7 Drawing Sheets

U.S. PATENT DOCUMENTS

2005/0018337 A1* 1/2005 Tsuchinaga .................. 360/39
2005/0169415 A1* 8/2005 Nayak et al. ................ 375/355

OTHER PUBLICATIONS

K. H. Mueller et al., "Timing Recovery in Digital Synchronous Data Receivers," *IEEE Transactions on Communications*, vol. COM-24, No. 5, May 1976, pp. 516-531.

F. M. Gardner, "A BPSK/QPSK Timing-Error Detector for Sampled Receivers," *IEEE Transactions on Communications*, vol. COM-34, No. 5, May 1986, pp. 423-429.

S. A. Raghavan et al., "On Feed-Forward and Feedback Timing Recovery for Digital Mangetic Recording Systems," *IEEE Transactions on Magnetics*, vol. 27, No. 6, Nov. 1991, pp. 4810-4812.

J. Moon et al., "Equalization for Maximum Likelihood Detectors," *IEEE Transactions on Magnetics*, vol. 31, No. 2, Mar. 1995, pp. 1083-1088.

J. Riba et al., "Conditional Maximum Likelihood Timing Recovery: Estimators and Bounds," *IEEE Transactions on Signal Processing*, vol. 49, No. 4, Apr. 2001, pp. 835-850.

P. M. Aziz et al., "Symbol Rate Timing Recovery for Higher Order Partial Response Channels," *IEEE Journal on Selected Areas in Communications*, vol. 19, No. 4, Apr. 2001, pp. 635-648.

A. R. Nayak et al., "Lower Bounds for the Performance of Iterative Timing Recovery at Low SNR," *15th International Symposium on Mathematical Theory of Networks and Systems*, University of Notre Dame, Aug. 12-16, 2002, 10 pgs.

J. S. Goldberg et al., "Timing Recovery for Magnetic Recording Using Cross Correlation," *IEEE Transactions on Magnetics*, vol. 38, No. 5, Sep. 2002, pp. 2289-2291.

J. R. Barry et al., "Iterative Timing Recovery," *IEEE Signal Processing Magazine*, Jan. 2004, pp. 89-102.

P. Kovintavewat et al., "Per-Survivor Timing Recovery for Uncoded Partial Response Channels," *Proc. Int. Conf. Commun. (ICC2004)*, Paris, France, Jun. 20-24, 2004, 5 pgs.

J. P. Keane et al., "Timing Recovery for the Magnetic Recording Channel Using the Wave Difference Method," *IEEE Transactions on Magnetics*, vol. 40, No. 4, Jul. 2004, pp. 3102-3104.

\* cited by examiner

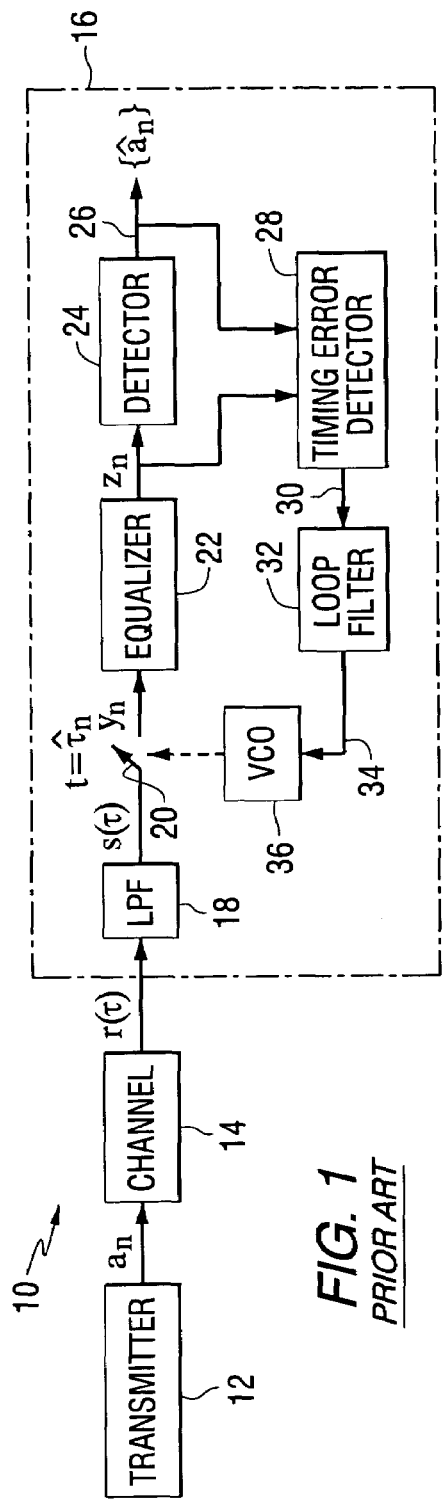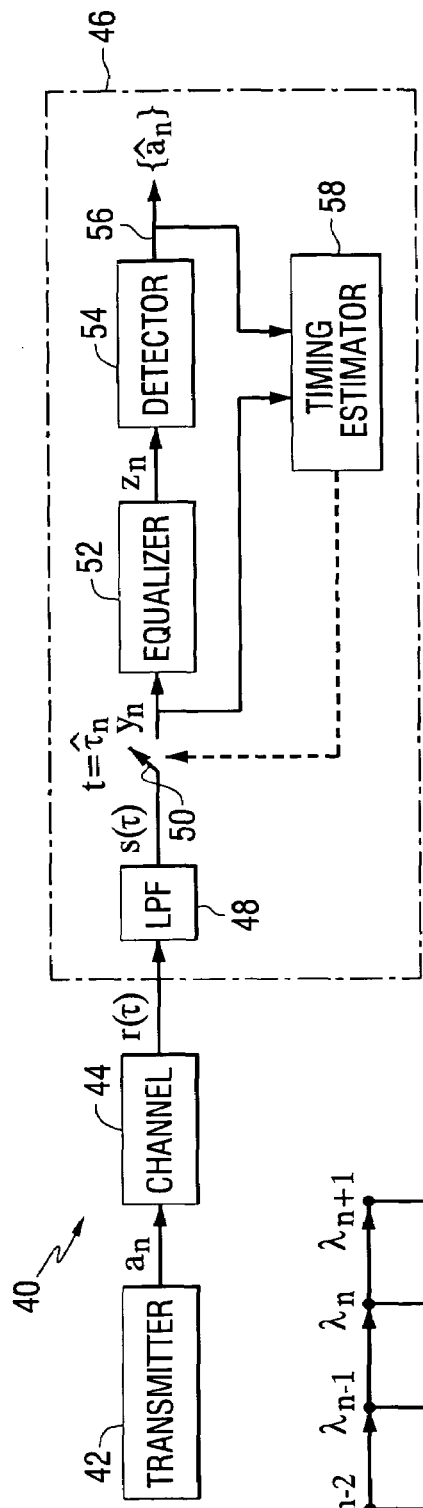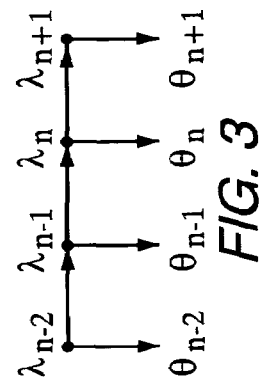

ROBUST MAXIMUM-LIKELIHOOD BASED TIMING RECOVERY

FIELD OF THE INVENTION

This invention relates to signal processing, and more particularly to timing recovery in receivers of communications systems.

BACKGROUND OF THE INVENTION

In communications systems where a transmitter sends information symbols to a receiver over time, there is a fundamental requirement that the receiver and transmitter operate according to a common clock. The receiver generally knows the nominal value of the transmission frequency, but the receiver clock is never truly synchronized with the transmitter clock. Thus, the receiver needs to recover the clock associated with the received signal from the signal itself. This problem of recovering the correct timing information from the received signal is called timing recovery or clock synchronization.

A magnetic recording system may be viewed as a communications system if the write head is viewed as a transmitter and the read head is viewed as the receiver. In magnetic recording, the desire to push recording densities higher has caused today's recording devices to operate at low signal-to-noise ratios (SNR) and with more sophisticated coding algorithms, making timing recovery more challenging. An analog signal produced at the read head is sampled to produce a plurality of samples. Traditional timing recovery architectures include a timing error detector that processes the received samples to produce a quantity that is a measure of the timing phase error. This quantity is further passed through a loop filter to produce a correction signal that is used to control the sampling timing, for example by driving a sampler through a voltage controlled oscillator (VCO). The system is decision directed, i.e., the detected bits are used by the timing recovery algorithm with the assumption that they are error free. A commonly used timing error detector is the Mueller and Müller (MM) detector.

Under ideal operation, the timing phase is updated by the timing recovery algorithm in a way such that the received signal is sampled at the proper locations. However, noise in the system can sometimes cause incorrect timing updates. For example, suppose that errors $j_n$ in the timing updates accumulate over several hundreds of bits to produce a net delay of one bit. There will certainly be several detection errors during this interval, but at the end of the interval, the detected bits will become error free but delayed by one bit. The result is that the timing error detector will not detect this one-bit offset in the sampling phase because it is decision directed and operates under the assumption that the decision bits are correct. Thus, any timing recovery that uses a decision directed approach suffers from the above phenomenon called cycle slip.

More generally, the timing phase can jump behind or ahead of the correct sampling phase by an integer number of bits and cause a cycle slip. The MM method performs quite well at high SNRs where the cycle slip rates are generally very low. Then the resulting bit error rates are nearly equal to that of the perfect timing case. However, at lower SNRs, the system is plagued by cycle slips, and the bit error rate rises.

Consequently, there is a need for a timing recovery technique that can be used in magnetic recording devices and other communications devices that operate at low SNRs.

SUMMARY OF THE INVENTION

This invention provides a method of timing recovery comprising: receiving an input signal, sampling the input signal to produce a plurality of signal samples, detecting the samples to produce an output signal, and controlling timing of the sampling using a maximum-likelihood estimation of timing error between an actual sampling time instant and a desired sampling time instant.

In another aspect the invention provides an apparatus comprising an input for receiving an input signal, a sampler for sampling the input signal to produce a plurality of signal samples, a detector for detecting the samples to produce an output signal, and a timing estimator for controlling timing of the sampler using a maximum-likelihood estimation of timing error between an actual sampling time instant and a desired sampling time instant.

The invention also encompasses a method of timing recovery comprising: receiving an input signal, sampling the input signal using a free-running clock to produce a plurality of signal samples, interpolating the signal samples to produce interpolated samples, detecting the interpolated samples to produce an output signal, and controlling interpolation of the signal samples using a maximum-likelihood estimation of timing error between an actual sampling time instant and a desired sampling time instant.

In another aspect, the invention provides an apparatus comprising an input for receiving an input signal, a sampler sampling the input signal using a free-running clock to produce a plurality of signal samples, an interpolator for interpolating the signal samples to produce interpolated samples, a detector for detecting the interpolated samples to produce an output signal, and a timing estimator for controlling interpolation of the signal samples using a maximum-likelihood estimation of timing error between an actual sampling time instant and a desired sampling time instant.

BRIEF DESCRIPTION OF THE DRAWINGS

FIG. 1 is a block diagram of the timing recovery portion of a conventional communications system.

FIG. 2 is a block diagram of the timing recovery portion of a communications system constructed in accordance with the present invention.

FIG. 3 is a schematic diagram of a Markov system.

DETAILED DESCRIPTION OF THE INVENTION

Figure 4:
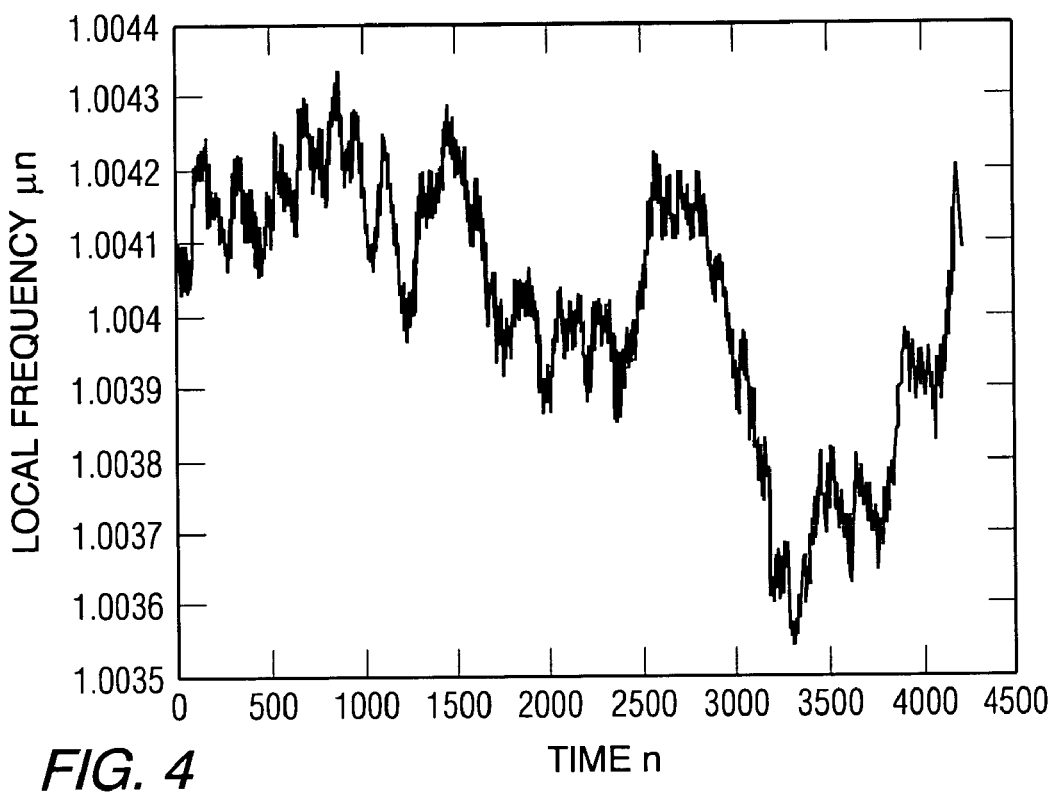
FIG. 4 is a graph illustrating a local clock frequency based on a random walk model.

Referring to the drawings, FIG. 1 is a block diagram of portions of a communications system 10 that uses conventional timing recovery. A transmitter 12 produces signals $a_n$ that are transmitted over a channel 14 to a receiver 16. The transmitted signals may be subject to noise or interference, resulting in signals $r(\tau)$ being received at the receiver.

The receiver includes a front end circuit 18 that can include a low pass filter, which produces a filtered signal $s(\tau)$. A sampler, illustrated as a switch 20, samples the filtered signal to produce a plurality of samples $y_n$ that form a digital representation of the filtered signal. An equalizer 22 equalizes the samples to produce a plurality of equalized samples $z_n$. A detector 24, which can be, for example, a Viterbi detector, processes the equalized samples to produce estimates $\hat{a}_{n_2}$ of the samples on line 26. A timing error detector 28 receives the equalized samples $z_n$ and the estimates $\hat{a}_n$, and processes these signals using an algorithm, such as the MM algorithm, to produce a timing error signal on line 30. The timing error signal passes through a loop filter 32 and the resulting filtered timing error signal on line 34 is used to control the frequency of a voltage controlled oscillator 36, which controls the sampling frequency of the sampler such that it produces samples at times $t=\hat{\tau}_n$, where $\hat{\tau}_n$ is an estimate of the ideal sampling time instant $\tau_n$. The timing error is the time between an actual sampling time instant and a desired sampling time instant. In this description the variable t is used as a generic variable to represent time.

This invention provides a method and apparatus for timing recovery for communications channels in general, and in one embodiment, for magnetic data storage channels, based on a maximum-likelihood (ML) estimation technique. When applied to data storage channels, a random walk model is used for the clocks associated with read and write heads that allows for imperfections such as slowly varying phase and frequency offsets of the clocks.

Bits are written on the magnetic medium by applying a magnetic field on the recording medium using the write head. The write head is controlled by a clock, which determines where the bit-transitions occur. To read these bits (at a later time), a read head senses the magnetic field on the medium and converts it into an electrical signal, which is further processed. The read process also uses a clock, which can be the same clock as the write clock. However the two clocks are to be considered non-synchronous because they operate at different times. The read channel samples the readback waveform, and processes the samples to recover the bits.

Timing recovery is a mechanism used to determine where to sample the signal. The nominal sampling frequency is known, but because no two clocks are synchronous, we need to determine exactly where to sample the signal using other means. This timing information is determined from the readback signal itself. There are two phases in (any) timing recovery method called the acquisition phase and the tracking phase. In a disc drive storage system, information is stored in sectors on a disc. Each sector includes a known (i.e., fixed) sequence of bits called the preamble, and data bits.

The acquisition phase corresponds to the first part (preamble) of the sector. The function of the preamble is to help the system acquire the correct timing information, i.e., the correct sampling phase and the correct sampling frequency.

The tracking phase follows the preamble part of the sector, and relates to the actual data bits for the user. These data bits are unknown (but will become known after the read head detects them). In the tracking phase, we make constant adjustments to the timing information to make sure that we are sampling at the right places. In the tracking phase, we use the detected bits in a feedback mode to help with the timing recovery. This is called a decision directed system.

There is fundamentally no difference between the preamble and data phases except that in the preamble phase, the algorithm uses the known preamble bits, while in the data phase, we use the detected user bits.

Timing recovery is important for the system to function without any cycle slips. The conventional method is simple and works well. But its performance degrades when the signal-to-noise ratio decreases, resulting in cycle slips. This invention combines some functions in the conventional system into a single "timing estimator" block that does the timing estimation optimally (in the maximum-likelihood (ML) sense).

The timing information is computed using a maximum-likelihood estimator. We begin with an initial guess of the timing information. This occurs even before the preamble. This may be incorrect, but in today's recording devices, the sampling phase is correct by about half a bit.

During the preamble, the timing information is updated and by the end of the preamble, we will have acquired the correct timing information (phase and frequency). Next, in the data phase, we use the decision directed approach, to constantly update the timing information.

Thus the algorithm sets an initial guess for timing information and its covariance matrix; and, for each readback sample, it updates the timing information and the covariance matrix. This updating is done efficiently and optimally.

Based on this model, estimates of the optimal sampling instants are derived. These estimates are optimal in the ML sense and also, asymptotically, in the minimum mean square error (MMSE) sense. This technique is robust and tracks changes in the clock phase and frequency extremely well.

This invention seeks to improve the system performance, specifically to reduce the cycle slip rate at low SNRs. One embodiment of the invention combines the timing error detector and the loop filter into one block and optimizes it. FIG. 2 is a block diagram of a communications system 40 that includes timing recovery performed in accordance with the present invention. A transmitter 42 produces signals $a_n$ that are transmitted over a channel 44 to a receiver 46. The transmitted signals may be subject to noise and/or interference, resulting in signals $r(\tau)$ being received at the receiver. The receiver includes a front end circuit 48 that can include a low pass filter, which produces a filtered signal $s(\tau)$. A sampler, illustrated as a switch 50, samples the filtered signal to produce a plurality of samples $y_n$ that form a digital representation of the filtered signal. An equalizer 52 equalizes the samples to produce a plurality of equalized samples $z_n$. A detector 54, which can be, for example, a Viterbi detector, processes the equalized samples to produce estimates $\hat{a}_n$ of the samples on line 56. A timing error detector 58 receives the plurality of samples $y_n$ and estimates $\hat{a}_n$ and subjects these signals to an algorithm, to produce a timing error signal. The timing error signal is used to control the sampling frequency of the sampler, such that it produces samples at times $t=\hat{\tau}_n$.

The timing error signal can be used to control a voltage controlled oscillator that controls the sampling frequency.

This invention can be applied to the readback signals in a magnetic recording system. A random walk model is used for the transmitter and receiver clocks, which are referred to as the write clock and read clock respectively. The clocks can have a slowly varying relative phase and frequency offset. Expressions are derived for the sampling instants that are optimal in the maximum-likelihood (ML) sense. These estimates also coincide with the minimum mean square error (MMSE) estimates asymptotically. The timing estimation can be performed efficiently using a simple algorithm. Like the conventional timing recovery algorithm, the algorithm used in this invention is also decision directed, implying that the readback waveform is processed along with the detected bits to estimate the future sampling instants.

The ideal readback waveform from a magnetic recording medium can be modeled as follows:

$$r(\tau) = \sum_m b_m h_T(\tau - mT) + z(\tau) \qquad (1)$$

where $$b_m = \frac{(a_m - a_{m-1})}{2}$$

is the transition sequence corresponding to the written bit sequence, and where $\{a_m = \pm 1\}$, which represents the magnetization of the data storage medium, T is the bit-width, $h_T(t)$ is the transition response of the system, defined as the response to a transition of the magnetization from $-1$ to $+1$, and $z(\tau)$ is the additive Gaussian electronic noise with a power spectral density height of $N_0/2$. This model ignores the effects of transition noise in the channel. The input bits are assumed to be independent and identically distributed (IID), i.e., the system is uncoded. For perpendicular recording, the transition response is $$h_T(t) = \mathrm{erf}\left(\frac{2t\sqrt{\ln 2}}{W}\right) \qquad (2)$$

where $$\mathrm{erf}(x) = \frac{2}{\sqrt{\pi}} \int_0^x e^{-t^2} dt$$

is the error function and W is the pulse width defined by the limits $t = \pm W/2$, and where the derivative of the transition response is one half of its peak value. For longitudinal recording $$h_T(t) = \frac{1}{1 + (2t/W)^2} \qquad (3)$$

where W is the pulse width defined by the limits $t = \pm W/2$, and where the transition response is one half of its peak value. The quantity W is the "50% pulse width" and is often written as PW50. Assuming that the channel response is essentially band-limited to the frequencies, $[-\tfrac{1}{2}T, \tfrac{1}{2}T]$, applying a front end analog low pass filter with cut-off frequencies $\pm\tfrac{1}{2}T$ produces the filtered readback waveform $$s(t) = \sum_m b_m h_T(t - mT) + w(t) \qquad (4)$$

where w(t) is the filtered Gaussian noise with a flat spectrum of $N_0/2T$ on $[-\tfrac{1}{2}T, \tfrac{1}{2}T]$. By Shannon's sampling theorem, samples of this waveform at $t=nT$, $n \in Z$ provide sufficient statistics, where Z is the set of integers, i.e., $\{\ldots, -2, -1, 0, 1, 2, \ldots\}$.

In the presence of transition jitter noise in the channel, the readback signal and the output of the front end filter are given by $$r(t) = \sum_m b_m h_T(t - mT - \Delta t_m) + z(t)$$

$$s(t) = \sum_m b_m h_T(t - mT - \Delta t_m) + w(t)$$

where $\Delta t_m$ is the transition jitter noise if there is a transition at time mT. The transition noise is modeled as an independent and identically distributed (IID) truncated Gaussian random variable with variance $\mathrm{var}(\Delta t_m) = \sigma_j^2$. The following definition of signal-to-noise ratio (SNR) of the channel has been adopted:

$$SNR = \frac{E_i}{N_0 + M_0}$$

$$E_i = W^2 \int_R |h'_T(t)|^2 dt$$

$$M_0 = \frac{E_i \sigma_j^2}{W^2}$$

where $E_i$ is the energy in the derivative of the transition response $h_T(t)$ scaled by $W^2$ to preserve the units of energy, and $M_0/2$ is the average transition noise energy per bit, which is obtained by using a first order Taylor series approximation to separate the effect of the transition noise from the clean signal.

The model for the readback waveform presented in equation (4) assumes that the read head and write head have synchronous clocks. Unfortunately, this assumption is not true and there are several factors that cause the read and write clocks to differ from each other. For instance, variations in the disc drive spindle speeds during the read and write processes cause the relative velocity between the head and the medium to be different every time data is written or read. In fact, during the course of one sector alone, the speed is non-constant. The fundamental problem of timing recovery is to use the readback waveform to estimate the write clock, i.e., to determine where to sample the waveform.

Random walk models can be used for the clocks. Assume that both the read and write clocks are imperfect and that the times on these clocks can be described in terms of an absolute clock (which is unavailable to the read and write heads) that maintains the absolute time. Denote the absolute time by t and the corresponding times on the read and write clocks by $\tau$ and $\tau'$ respectively, then:

$\tau = f_r(t)$ $\tau' = f_w(t)$ where $f_r(t)$ and $f_w(t)$ are the clock mapping functions, which are continuous, monotonically increasing, invertible functions. The slopes of these functions are nearly unity, implying that their frequencies are nearly correct. Of course, if both clocks were synchronized to the absolute time, then $\tau = \tau' = t$.

The readback signal at time $\tau$ on the read clock corresponds to an absolute time $t = f_r^{-1}(\tau)$. If the write clock were perfect, i.e., $\tau' = t$, then the actual readback waveform of equation (1) is modified as follows:

$$r(\tau) = \sum_m b_m h_T(f_r^{-1}(\tau) - mT) + z(\tau).$$

However, the write clock is not perfect and the transitions are written at time instants $\tau' = mT$ where $m \in \mathbb{Z}$. Their corresponding absolute times are $t = f_w^{-1}(mT)$. Therefore, the above expression can be further modified to obtain the actual readback waveform $$r(\tau) = \sum_m b_m h_T(f_r^{-1}(\tau) - f_w^{-1}(mT)) + z(\tau). \quad (5)$$

This expression is unwieldy, and can be subjected to a few simplifications. Note that for any $t_1$ and $t_2$, we have $(f_r(t_1) - f_r(t_2)) = (t_1 - t_2)\mu$ where $\mu \cong 1$ is the average slope of $f_r(t)$ on $[t_1, t_2]$. Therefore, the dominant term in the Taylor series expansion yields $h_T(f_r(t_1) - f_r(t_2)) - h_T(t_1 - t_2) \cong (\mu - 1)(t_1 - t_2) h_T'(t_1 - t_2).$ For both perpendicular and longitudinal modes of recording, the function $th_T'(t)$ decays to zero quickly. Therefore, $|h_T(f_r(t_1) - f_r(t_2)) - h_T(t_1 - t_2)| \leq C|\mu - 1|$ where $C = \max_t th_T'(t)$. It is easily verified that $C = 0.5$ for longitudinal recording and $C = \sqrt{2\pi}e^{-0.5} = 0.4839$ for perpendicular recording. Applying this to $t_1 = f_r^{-1}(\tau)$ and $t_2 = f_w^{-1}(mT)$ we obtain $|h_T(\tau - f_r(f_w^{-1}(\tau))) - h_T(f_r^{-1}(\tau) - f_r^{-1}(\tau) - f_w^{-1}(mT))| \leq C|\mu - 1|.$ The error incurred by replacing $h_T(t_1 - t_2)$ by $h_T(f_r(t_1) - f_r(t_2))$ is in the same order of magnitude as the frequency offset in the read clock $\mu - 1$ that is usually about a fraction of a percent. This error is negligible compared to the additive in-band electronic noise in the system. Therefore, equation (5) can be approximated as $$r(\tau) \simeq \sum_m b_m h_T(\tau - f_r(f_w^{-1}(mT))) + z(\tau). \quad (6)$$

Now, at the output of the front end low pass filter, we have $$s(\tau) = \sum_m b_m h_T(\tau - f_r(f_w^{-1}(mT))) + w(\tau) \quad (7)$$

$$\simeq \sum_m b_m h_T(f_w(f_r^{-1}(\tau)) - mT) + w(\tau) \quad (8)$$

where the second step follows from a similar approximation as before, and $w(\tau)$ is the additive Gaussian noise band-limited to $[-\frac{1}{2}T, \frac{1}{2}T]$ with a flat spectrum of $N_0/2T$. From equation (8), it is clear that the desired sampling locations with respect to the read clock are approximately $\tau_m := \tau(mT)$ where $\tau(\tau') := f_r(f_w^{-1}(\tau'))$.

Instead of modeling $f_r(t)$ and $f_w(t)$ separately, it is convenient to model $\tau(\tau') = f_r(f_w^{-1}(\tau'))$ or the read clock relative to the write clock using the following random walk model for the function $\tau(\tau')$:

$$\tau(\tau') = \tau(0) + \int_0^{\tau'} \mu(x) dx + \int_0^{\tau'} \rho(x) dx \quad (9)$$

where $\rho(x)$ is a white noise and $\mu(x)$ is the local clock frequency, which is also slowly varying according to a random walk model:

$$\mu(\tau') = \mu(0) + \int_0^{\tau'} \sigma(x) dx. \quad (10)$$

The quantities $\rho(x)$ and $\sigma(x)$ are Gaussian noise processes with power spectral densities $S_\rho(f) = \sigma_R^2$ and $S_\sigma(f) = \sigma_S^2$ respectively. We assume that $\sigma_S$ is small enough so that the local relative clock frequency is approximately unity, i.e., $\mu(x) \cong 1$ for several thousands of cycles.

Recall that $\tau_n = \tau(nT)$ are the desired sampling times on the read clock. Also let $\mu_n = \mu(nT)$. Then, these quantities are modeled by the following difference equations:

$$\tau_n = \tau_{n-1} + T\mu_{n-1} + r_n \quad (11)$$

$$\mu_n = \mu_{n-1} + s_n \quad (12)$$

or in vector form as the following random walk process $$\lambda_n = \begin{pmatrix} 1 & T \\ 0 & 1 \end{pmatrix} \lambda_{n-1} + \upsilon_n \quad (13)$$

where $$\lambda_n = \begin{pmatrix} \tau_n \\ \mu_n \end{pmatrix}, \quad \upsilon_n = \begin{pmatrix} r_n \\ s_n \end{pmatrix}$$

and $$E[\upsilon_n \upsilon_m^T] = \delta_{mn} \begin{pmatrix} \sigma_R^2 T + \sigma_S^2 T^3/3 & \sigma_S^2 T^2/2 \\ \sigma_S^2 T^2/2 & \sigma_S^2 T \end{pmatrix}. \quad (14)$$

The variable $\lambda_n$ is a vector consisting of the phase and frequency information at time n. $\lambda_n$ can be called the timing information vector. The variable $\upsilon_n$ is a Gaussian noise whose statistics are given in equation (14).

FIG. 1 shows the block diagram of a conventional timing recovery system. The channel output is filtered and sampled to produce the readback signal $s(\tau)$. These samples are equalized and detected to produce estimates $\{\hat{a}_n\}$ of the input bits. The timing error detector is controlled by the equalized samples $z_n$ and the detected data $\hat{a}_n$.

From the data processing theorem, it is clear that we can extract more information about $\tau_n$ by processing the equalizer input $y_n$ instead of the output $z_n$. While the conventional MM method processes the equalized samples $z_n$, the ML method (as illustrated in FIG. 2) uses the raw sequence $y_n$. For this approach, we require knowledge of the dibit response of the channel.

The invention can also be implemented in a variant of the ML method that processes the equalized sequence $z_n$ just like the MM method. For this variant, the system of FIG. 2 would be modified to use $z_n$ and $\hat{a}_n$ as the inputs of the timing estimator. This method does not require knowledge of the dibit response. Hence it is more attractive from a practical viewpoint. The mathematical analysis for the variant ML method is a straightforward modification of the original ML method.

The system of FIG. 2 combines the timing error detector, loop filter and the voltage controlled oscillator (VCO) blocks into a single block labeled timing estimator 58. As in the conventional system, we use a decision directed approach and the assumption that $a_n = \hat{a}_n$ most of the time. Although a VCO is not shown, the system can be implemented using one.

In a disc drive storage system, data is written in sectors on a disc. As with the conventional method, we require a preamble at the start of each sector to ensure proper acquisition of the timing information. The preamble is a fixed bit-sequence that is used for the initial acquisition of the timing information. During the preamble part of the sector, we do not use the detected bits $\hat{a}_n$ to estimate the timing information. Instead, we use the actual preamble bits, which are known to the receiver, until the timing information is obtained. At the end of the preamble, we switch to the data mode where the timing information is updated using the detected bits $\hat{a}_n$. This is the decision directed mode.

Let $s^o(t)$ denote the ideal noise-free readback waveform:

$$s^o(t) = \sum_m b_m h_T(t - mT) \qquad (15)$$
$$= \sum_m a_m h_D(t - mT)$$

where $$h_D(t) = \frac{(h_T(t) - h_T(t-T))}{2}$$

is the dibit response. Denote its samples at $t=nT$ by $$y_n^o = s^o(n) = \sum_m a_{n-m} h_D(mT). \qquad (16)$$

The superscript "o" indicates that the readback signal is ideal and devoid of imperfections due to clock jitter or noise.

Suppose that we have an estimate $\hat{\tau}_n$ of the sampling time $\tau_n$, which is obtained from an earlier step of the timing recovery algorithm. The corresponding sample of the filtered readback waveform can be written in terms of the ideal readback waveform using equation (8):

$$y_n := s(\hat{\tau}_n) \qquad (17)$$
$$= \sum_m b_m h_T(f_w(f_r^{-1}(\hat{\tau}_n)) - mT) + w(\hat{\tau}_n)$$
$$\equiv s^o(f_w(f_r^{-1}(\hat{\tau}_n))) + w(\hat{\tau}_n)$$

Now, observe that $$f_w(f_r^{-1}(\hat{\tau}_n)) \simeq f_w(f_r^{-1}(\tau_n)) + (\hat{\tau}_n - \tau_n) \left[\frac{d f_w(f_r^{-1}(\hat{\tau}))}{dt}\right]_{t=\tau_n} \qquad (18)$$
$$= nT + (\hat{\tau}_n - \tau_n)$$

where we use the first order Taylor approximation, the approximation that the local clock frequencies of the read and write clock are both close to unity, and $f_w(f_r^{-1}(\tau_n))=nT$.

Combining equations (17) and (18), we obtain $$y_n = s(\hat{\tau}_n) \simeq s^o(nT) + (\hat{\tau}_n - \tau_n)\left[\frac{ds^o(t)}{dt}\right]_{t=nT} + w(\hat{\tau}_n). \qquad (19)$$

Using equations (15), (16) and (19) we obtain $$y_n = y_n^o + (\hat{\tau}_n - \tau_n)\sum_m a_{n-m}\left[\frac{dh_D(t)}{dt}\right]_{t=mT} + w(\hat{\tau}_n) \qquad (20)$$
$$= y_n^o + \gamma_n(\tau_n - \hat{\tau}_n) + w_n \qquad (21)$$

where $\text{var}(w_n) = \sigma_w^2 = N_0/2T$, $$\gamma_n = -\sum_m a_{n-m}\left[\frac{dh_D(t)}{dt}\right]_{t=mT}. \qquad (22)$$

Since $\hat{\tau}_n$ is a known quantity from a previous estimation step, we can calculate the following quantity $$\theta_n := (y_n - y_n^o) + \gamma_n \hat{\tau}_n \qquad (23)$$
$$= \gamma_n \tau_n + w_n$$

which we term as our "observation" of $\tau_n$ at time n. Note that, to calculate $y_n^o$ and $\gamma_n$, we need all the past and future data input bits. A workaround for this issue is to truncate the tail parts of the summations (16) and (22) and replace the actual bits by detected bits, i.e., $$y_n^o \simeq \sum_{m=-J}^{J_o} \hat{a}_{n-m} h_D(mT) \qquad (24)$$

$$\gamma_n \simeq -\sum_{m=-J}^{J_0} \hat{a}_{n-m}\left[\frac{dh_D(t)}{dt}\right]_{t=mT} \qquad (25)$$

where $J_0$ and $J$ are sufficiently large integers. In general, larger values of $J_0$ and $J$ yield better approximations. However, the above expression depends on $\hat{a}_{n+J}$ which implies an unavoidable delay of J bits between the detector and the timing estimator. Although a large value for $J_0$ does not affect the loop delay, it does affect the complexity. Since much of the dibit response energy lies in $[-2W, 2W]$, we choose $J=\lceil 2W/T \rceil$ and a more liberal choice of $J_0=\lceil 5W/T \rceil$, where $\lceil . \rceil$ is the ceiling function or the smallest integer upper bound.

Ideally, we would like to use the observations $\{\theta_k : k \leq n\}$ to estimate the next sampling instant $\tau_{n+1}$. However, there is a delay in computing $\theta_n$ for the following reason. Suppose that the equalizer has length 2K+1 and is centered at the origin, it has K non-causal taps and hence introduces a delay of K samples in the forward link. Additionally, the detector introduces a certain delay. For instance the Viterbi detector, although a sequence detector, can be made to produce sub-optimal decisions after decoding through a depth of D bits in the trellis. This causes a delay of D bits. Thus the total delay in the timing loop is L=J+K+D, i.e., the earliest time when $\theta_n$ and $\gamma_n$ can be computed is n+L. Thus, our estimation algorithm must be able to predict not just $\tau_{n+1}$ but the future value $\tau_{n+L+1}$ where L is the loop delay described above:

$$\hat{\tau}_{n+L+1} := E[\tau_{n+L+1} | \theta_k : k \leq n]. \tag{26}$$

Note that we can presumably improve the timing phase estimate if we use all the available information. This would translate to conditioning additionally on $\{y_k : n < k \leq n+L\}$ in the above estimation:

$$\hat{\tau}_{n+L+1} := E[\tau_{n+L+1} | \{\theta_k : k \leq n\}, \{y_k : n < k \leq n+L\}]. \tag{27}$$

However, this is a hard problem because it is no longer a Gaussian estimation problem. For the purpose of this description, we consider only the estimation in equation (26), although slightly sub-optimal. The estimation is described fully below where we derive the ML estimate of the timing information and discuss its optimality.

The transition response $h_T(t)$ is needed to compute $y_n^o$ and $\gamma_n$. The transition response can be estimated from a large training sequence. These coefficients need not be known with very high precision because any estimation errors in these coefficients can be absorbed into the noise term $w_n$, and $\sigma_w$ can be adjusted accordingly.

Equation (23) indicates that the observation at time n is expressible as $$\theta_n = \gamma_n \tau_n + w_n \tag{28}$$

where $\gamma_n$ is known and $w_n$ is an IID Gaussian noise with variance $\sigma_w^2$. The ideal sampling instants $\tau_n$ and local clock frequencies $\mu_n$ are described by the random walk model (13). The random variables $\lambda_n$ and $\theta_n$ clearly form a Markov chain whose dependence is illustrated in FIG. 3. The function of the timing estimator block is to compute the optimal estimate of $\tau_{L+n+1}$ from the observations $\{\theta_k : k \leq n\}$. However, in the following analysis, we derive a more general expression for estimates of the current and all future values $\tau_m$, $m \geq n$ from the observations $\theta_0^n := \{\theta_k : k \leq n\}$. Since all the random variables in this problem are jointly Gaussian, the estimates can be expressed as linear functions of the observations $\theta_0^n$.

A consequence of the random walk model is that at steady state (large n), the variances of $\tau_n$ and $\mu_n$ approach $\infty$. In other words, the prior information on these quantities vanish at steady state implying that their minimum mean square estimates (MMSE) coincide with their (unbiased) maximum-likelihood estimates (MLE). We shall focus on the MLE alone, but for convenience we write the estimates of $\tau_m$ and $\mu_m$ for $m \geq n$ given $\theta_0^n$ as expectations with the understanding that the steady state assumption is used, i.e., $$\hat{\tau}_m^{(n)} = E[\tau_m | \theta_0^n] \tag{29}$$

$$\hat{\mu}_m^{(n)} = E[\mu_m | \theta_0^n] \tag{30}$$

where $E[\cdot]$ denotes the expectation. The subscript m denotes the index of the quantity that we are estimating and superscript n denotes the highest index of the observation used for estimation. The above equations can be written compactly as $$\hat{\lambda}_m^{(n)} = E[\mu_m | \theta_0^n], \ m \geq n. \tag{31}$$

Observe that equation (13) implies that $$\lambda_m = \begin{pmatrix} 1 & T \\ 0 & 1 \end{pmatrix}^{m-n} \lambda_n + \sum_{k=n+1}^{m} \begin{pmatrix} 1 & T \\ 0 & 1 \end{pmatrix}^{m-k} v_k$$

$$= \begin{pmatrix} 1 & (m-n)T \\ 0 & 1 \end{pmatrix} \lambda_n + \sum_{k=n+1}^{m} \begin{pmatrix} 1 & (m-k)T \\ 0 & 1 \end{pmatrix} v_k.$$

Now, $\{v_k : k > n\}$ has a zero-mean and is independent of the observations $\theta_0^n$. Thus, $$\hat{\lambda}_m^{(n)} = E[\lambda_m | \theta_0^n] \tag{32}$$

$$= \begin{pmatrix} 1 & (m-n)T \\ 0 & 1 \end{pmatrix} E[\lambda_n | \theta_0^n]$$

$$= \begin{pmatrix} 1 & (m-n)T \\ 0 & 1 \end{pmatrix} \hat{\lambda}_n^{(n)}.$$

Equivalently, $$\hat{\tau}_m^{(n)} = \hat{\tau}_n^{(n)} + (m-n)T\hat{\mu}_n^{(n)} \tag{33}$$

$$\hat{\mu}_m^{(n)} = \hat{\mu}_n^{(n)}. \tag{34}$$

Therefore, it suffices to compute $\lambda_n^{(n)}$. The estimates of $\lambda_m$ for $m \geq n$ are given by equation (32).

A direct computation of equation (31) is prohibitive because its computational complexity grows as n grows. Fortunately, there is a simple technique that allows us to compute these estimates recursively and efficiently. We first present a useful result.

Lemma 1: Suppose A→B→C→D is a Markov chain, then P(C|ABD)=P(C|BD). This is proved easily by the property of conditional probabilities:

$$P(C | ABD) = \frac{P(CD | AB)}{P(D | AB)}$$

$$= \frac{P(CD | B)}{P(D | B)}$$

$$= P(C | BD).$$

Since all of the random variables in this description are Gaussian, the following is a Markov chain:

$$\theta_0^{n-1} \to \hat{\lambda}_{n-1}^{(n-1)} \to \lambda_{n-1} \to \lambda_n \to \theta_n.$$

The Markov property of $\theta_0^{n-1} \to \hat{\lambda}_{n-1}^{(n-1)} \to \lambda_{n-1}$ follows because the estimated error $\hat{\lambda}_{n-1}^{(n-1)} - \lambda_{n-1}$ is uncorrelated and independent of the observations $\theta_0^{n-1}$, while the Markov property of $\hat{\lambda}_{n-1}^{(n-1)} \to \lambda_{n-1} \to \lambda_n \to \theta_n$ follows because $v_n$ and $w_n$ are independent of each other and of $\hat{\lambda}_{n-1}^{(n-1)}$ which is a linear function of $\theta_0^{n-1}$.

Consider the estimate $\hat{\lambda}_n^{(n)}$ at time n. This quantity can be expressed as $$\theta_0^{n-1} \to \hat{\lambda}_{n-1}^{(n-1)} \to \lambda_{n-1}$$

because $\hat{\lambda}_{n-1}^{(n-)}$ is a function of $\theta_0^{n-1}$. We have already shown that $\theta_0^{n-1} \to \hat{\lambda}_{n-1}^{(n-1)} \to \lambda_{n-\theta n}$ is a Markov chain.

Therefore, by lemma 1 we can drop the conditioning on $\theta_0^{n-1}$ in the above expectation to obtain $$\hat{\lambda}_n^{(n)} = E[\lambda_n | \theta_n, \hat{\lambda}_{n-1}^{(n-1)}]. \quad (35)$$

Two expressions for the estimate of $\hat{\lambda}_n^{(n)}$ (the timing information) are shown above. Equation (31) says that $\hat{\lambda}_n$ is the expectation of $\lambda_n$ conditioned on all the past observations: $\theta_0^n = \{\theta_0, \ldots, \theta_n\}$. We use the Markov chain property to simplify this expression to (35), which is also a conditional expectation, but depends only on two quantities: the last observation $\theta_n$, and the last estimate $\hat{\lambda}_{n-1}^{(n-1)}$. Equation (35) can be computed in an efficient way unlike equation (31). This simplification does not compromise accuracy because both these expressions are equal to each other.

The quantities $\theta_n$ and $\hat{\lambda}_{n-1}^{(n-1)}$ provide sufficient statistics for estimating $\lambda_n$ and we have recast our estimation into the above simple form. At time $n-1$, let $$\hat{\lambda}_{n-1}^{(n-1)} = \lambda_{n-1} + u_{n-1}^\lambda$$

where $u_{n-1}^\lambda$ is the estimation error of $\lambda_{n-1}$ having covariance $K_{n-1}$:

$$K_{n-1} = E[u^{n-1\lambda}(u_{n-1}^\lambda)^T]. \quad (36)$$

Using equations (13) and (28), we can express our sufficient observations for estimating $\lambda_{n+1}$ as $$\theta_n = \gamma_n \tau_n + w_n$$

$$\hat{\lambda}_{n-1}^{(n-1)} = \lambda_{n-1} + u_{n-1}^\lambda$$

$$= \begin{pmatrix} 1 & -T \\ 0 & 1 \end{pmatrix}(\lambda_n - v_n) + u_{n-1}^\lambda.$$

Therefore, our sufficient statistics are $$\begin{pmatrix} \theta_n \\ \hat{\lambda}_{n-1}^{(n-1)} \end{pmatrix} = A_n \lambda_n + \eta_n \quad (37)$$

where $$A_n = \begin{pmatrix} \gamma_n & 0 \\ 1 & -T \\ 0 & 1 \end{pmatrix} \text{ and } \eta_n = \begin{pmatrix} w_n \\ \begin{pmatrix} 1 & -T \\ 0 & 1 \end{pmatrix} v_n + u_{n-1}^\lambda \end{pmatrix}.$$

The covariance matrix of $\eta_n$ is readily computed using equations (14) and (36):

$$C_n := E[\eta_n \eta_n^T] \quad (38)$$

$$= \begin{pmatrix} \sigma_W^2 & 0 & 0 \\ 0 & \sigma_R^2 T + \sigma_S^2 T^3/3 & -\sigma_S^2 T^2/2 \\ 0 & -\sigma_S^2 T^2/2 & \sigma_S^2 T \end{pmatrix} + \begin{pmatrix} 0 & 0 \\ 0 & K_{n-1} \end{pmatrix}.$$

Finally, using equations (37), (38) and we obtain the estimate in equation (35)

$$\hat{\lambda}_n^{(n)} = E[\lambda_n | \theta_n, \hat{\lambda}_{n-1}^{(n-1)}] \quad (39)$$

$$= (A_n^T C_n^{-1} A_n)^{-1} A_n^T C_n^{-1} \begin{pmatrix} \theta_n \\ \hat{\lambda}_{n-1}^{(n-1)} \end{pmatrix}.$$

Combining Equations (37) and (39) we obtain $$\hat{\lambda}_n^{(n)} = \lambda_n + u_n^\lambda$$

where the estimation error and its covariance at time n are $$u_n^\lambda = (A_n^T C_n^{-1} A_n)^{-1} A_n^T C_n^{-1} \eta_n \quad (40)$$

$$K_n = E[u_n^\lambda (u_n^\lambda)^T] = (A_n^T C_n^{-1} A_n)^{-1}. \quad (41)$$

The covariance matrix in equation (41) is used for estimation in the next iteration. Assuming that the delay in the feedback loop is L, our timing estimate $\hat{\tau}_{n+L+1}$ is computed using equations (26) and (33):

$$\hat{\tau}_{n+L+1} = \hat{\tau}_n^{(n)} + (L+1)T\hat{\mu}_n^{(n)}.$$

The ML estimation algorithm can be summarized as follows:
1. Choose initial values for $\hat{\lambda}_{-1}^{(-1)}$ and $K_{-1}$.
2. Set $\hat{\tau}_k = kT$ for $k \leq L$.
3. For n=0, 1, 2 ... do steps 4-8.
4. Obtain $\theta_n$ and $\gamma_n$ from the timing error detector.
5. Compute $C_n$ using equation (38).
6. Compute $\hat{\lambda}_n^{(n)}$ using equation (39).
7. Compute $\hat{\tau}_{n+L+1} = (1(L+1)T)\hat{\lambda}_n^{(n)}$.
8. Update $K_n$ using equation (41).
9. End The initial value for $\hat{\lambda}_{-1}^{(-1)}$ can be taken as $$\hat{\lambda}_{-1}^{(-1)} = \begin{pmatrix} \hat{\tau}_{-1}^{(-1)} \\ \hat{\mu}_{-1}^{(-1)} \end{pmatrix}$$

$$= \begin{pmatrix} -T \\ 1 \end{pmatrix}$$

and $K_{-1}$ is chosen to reflect our uncertainty of these estimates. A large value of $K_{-1}$ would appear be a conservative choice since it reflects our noncommittal feeling about the initial estimates. However, this choice causes the phase and frequency updates in the first few iterations to be so large that the Taylor series approximations break down. This can yield cycle slips at the very start of the sector.

In today's magnetic recording media, the initial phase offset is generally within one half of a cycle and the frequency offset is less than 1%. Thus, we can adopt a more liberal choice such as $$K_{-1} = \begin{pmatrix} T^2/4 & 0 \\ 0 & 10^{-4} \end{pmatrix} \quad (42)$$

or any matrix whose entries are in the same order of magnitude since the performance is not very sensitive to the precise value of $K_{-1}$. Finally, a very small value for $K_{-1}$ is undesirable because it makes the initial updates very sluggish and slows down the convergence rate. The result is that large frequency offsets are not tracked quickly. The ML algorithm automatically updates this covariance matrix $K_n$ in each iteration and the covariance matrix converges to the same value independent of $K_{-1}$.

Apart from its optimality, the ML estimation method has several advantages over the conventional MM method. For example, we do not need to rely on any heuristics or a trial and error approach as in the design of a loop filter in the conventional algorithm. Also, we do not need to modify any coefficients in the acquisition and tracking phases of the algorithm. For the ML method, we need to specify only an initial estimate and a covariance matrix $K_{-1}$ describing the uncertainty of the timing information. Finally, the quantities $\sigma_R$ and $\sigma_S$ are properties of the mechanical system (head and medium combination) and can be estimated for a particular storage device.

The performance of the above algorithm can be compared with a conventional Mueller and Müller based algorithm to demonstrate that the ML algorithm converges quickly and tracks changes in the phase and frequency extremely well. It performs better than the conventional MM method in terms of bit error rates (BERs) and cycle slip rates (CSRs), as well as the variance of the steady state timing error. Variants of the ML algorithms can be applied to different signal and channel models.

The performance of the ML timing estimation algorithm for an uncoded magnetic recording channel by computer simulation can be compared with a conventional method that uses the MM timing error detector. We consider longitudinal and perpendicular modes of recording at a normalized recording density of $W/T=2$. In the simulations, sectors consisting of 4096 information bits and an additional 100 bits for the preamble are processed. An equalizer of length $2K+1=11$ designed for a monic generalized partial response (GPR) target of length 3, and a Viterbi detector with detection depth of $D=4$ bits were used. In the implementations of (16) and (22) we kept only $J=4$ non-causal terms and $J_0=10$ causal terms. Therefore, the net delay in the timing recovery loop is $L=K+D+J=13$ bits. Thus our ML estimates of the timing phase and frequency are $$\hat{\tau}=\hat{\tau}_n^{(n-14)} \text{ and } \hat{\mu}_n=\hat{\mu}_n^{(n-14)}.$$

Note that at the start of the sector (i.e., the timing acquisition part) causality is not an issue because the preamble data bits are known. Thus, during acquisition we have $L=0$, i.e., $$\hat{\tau}_n=\hat{\tau}_n^{(n-1)} \text{ and } \hat{\mu}_n=\hat{\mu}_n^{(n-1)}$$

and switch to $L=13$ at the end of the preamble.

Although we derived our ML estimation algorithm assuming no transition jitter noise, we consider simulations of channels with and without this noise. Our definition of the effective SNR due to the electronic and transition noise is $$SNR = \frac{E_i}{N_0 + M_0}.$$

In our simulations, we choose $T=1$ without loss of generality. The actual frequency offset encountered in a real system is the range of 0.2% to 0.4% and the initial phase offset is about 0.5 of a clock pulse. In all the simulations, we choose an initial phase offset of $\tau_0=0.5T$ and a frequency offset of 0.4%, i.e., $\mu_0=1.004$. We also allow the local frequency to change slowly according to the random walk model described by equations (11) and (12). The values of $\sigma_R$ and $\sigma_S$ control the rate at which the clock frequency drifts. FIG. 4 illustrates a typical realization of $\mu_n$ (the actual local frequency of the write clock relative to the read clock) generated from the random walk model for $$\sigma_S=1=10^{-5}.$$

FIG. 4 shows that these parameters allow for realistic changes in the frequency offset during the course of one sector. We use $\sigma_R=\sigma_S=10^{-5}$ in our simulations.

Figure 5:
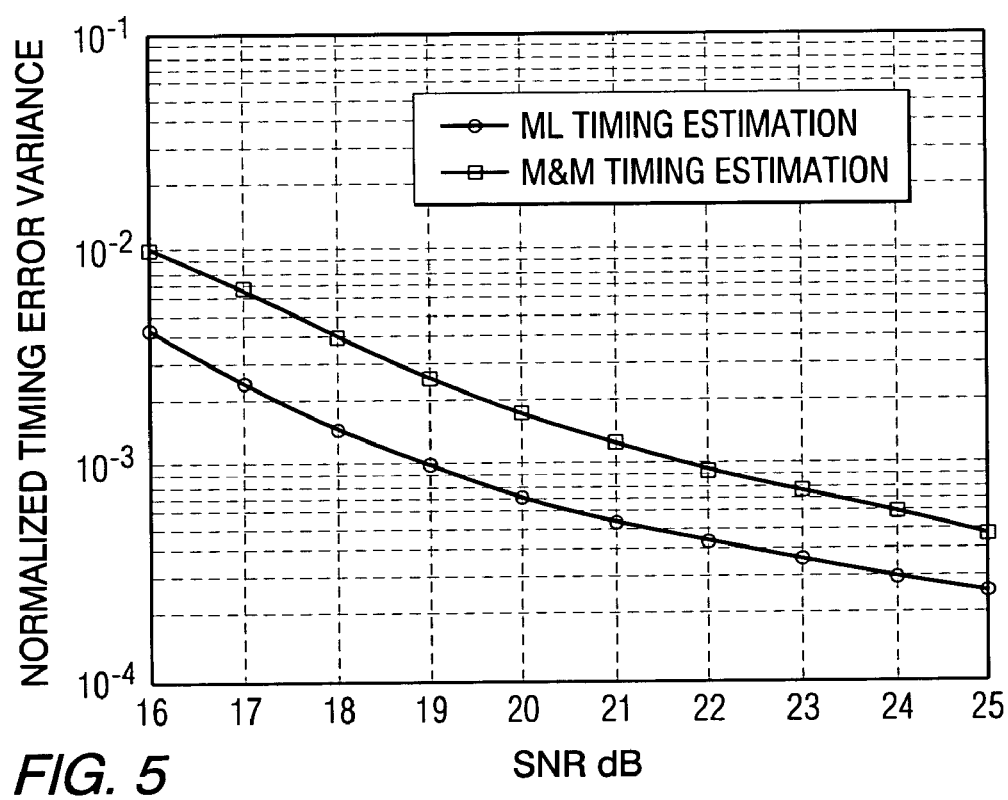
FIG. 5 is a graph showing a comparison of timing error variance for longitudinal recording.
Figure 6:
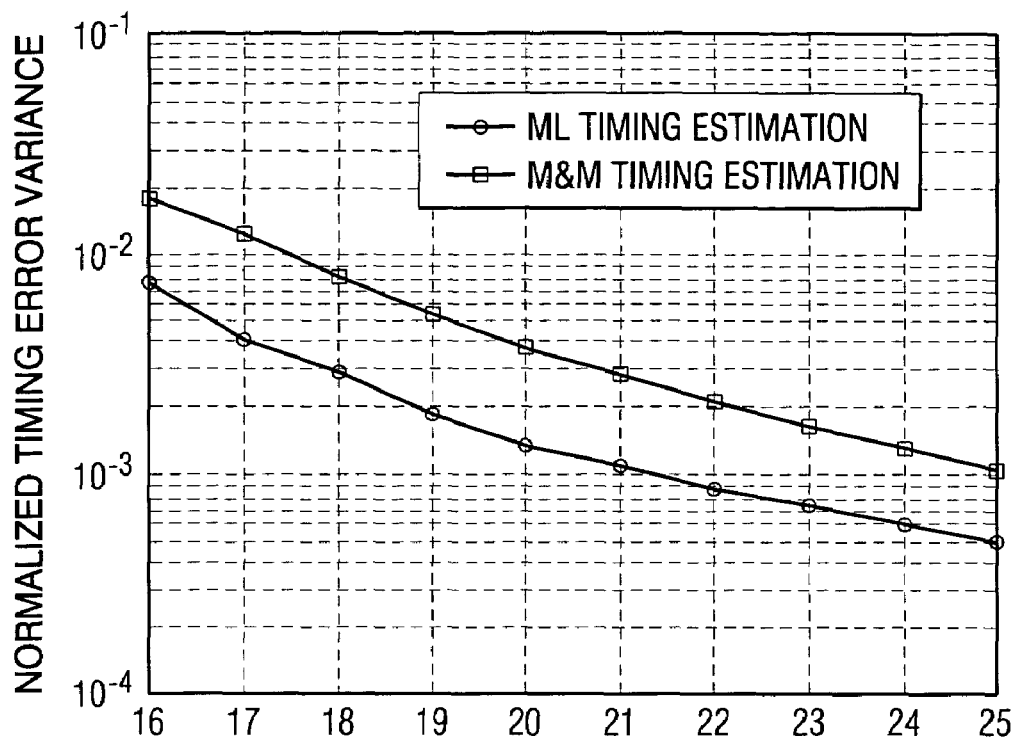
FIG. 6 is a graph showing a comparison of timing error variance for perpendicular recording.
Figure 7:
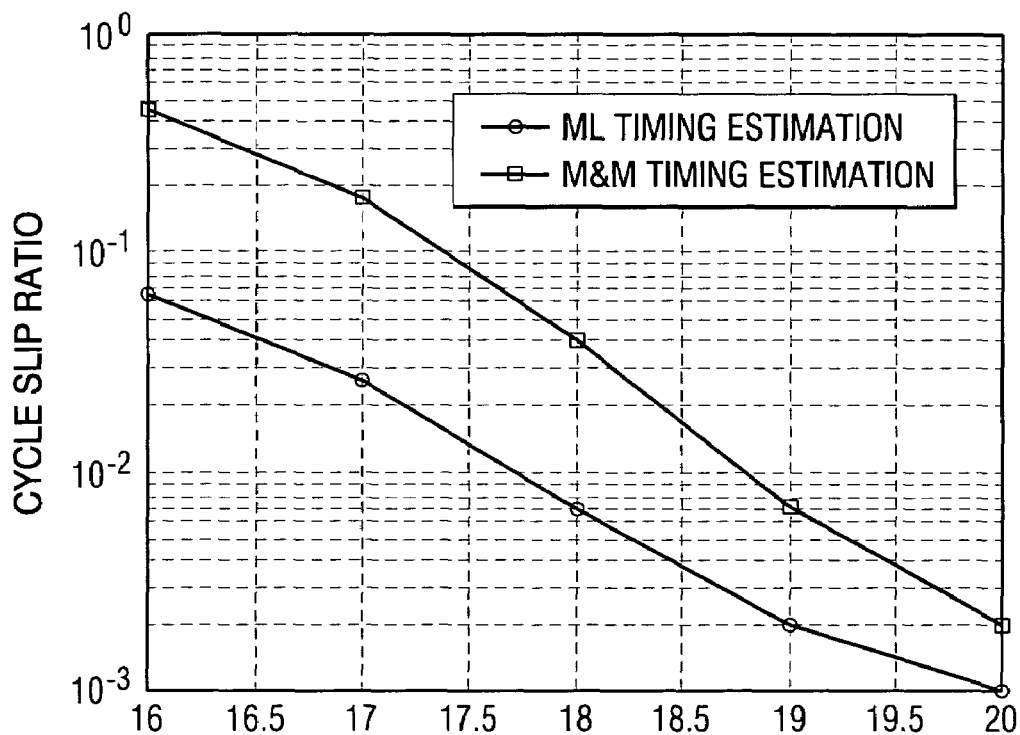
FIG. 7 is a graph showing a comparison of cycle slip rate (CSR) for longitudinal recording.
Figure 8:
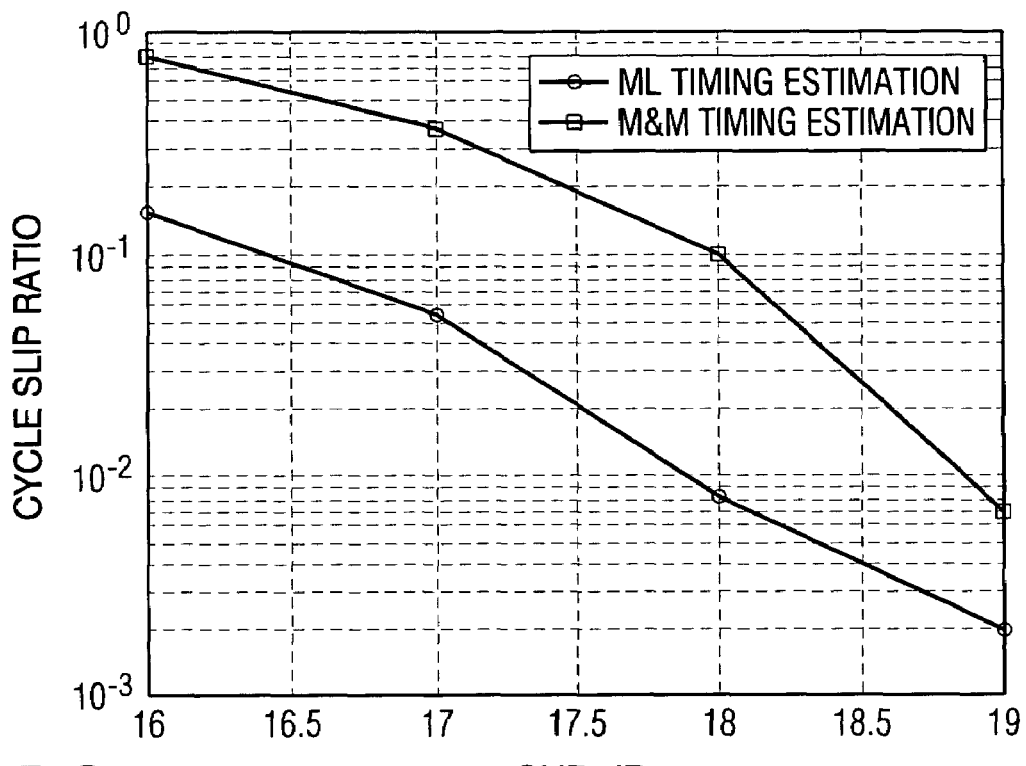
FIG. 8 is a graph showing a comparison of CSR for perpendicular recording.

We first consider the case with no transition noise, i.e., $M_0=0$ for $SNR=E_i/N_0$ in the range 16 dB to 25 dB. At 16 dB, the SNR is considered very low as it produces raw bit error rates well in excess of $10^{-2}$. We evaluate the performance of the ML and the conventional local frequency algorithms in terms of their cycle slip rate (CSR) and timing error variance. FIGS. 5 and 6 compare the normalized steady state timing error variance for the two modes of recording (longitudinal and perpendicular). FIG. 5 shows a comparison of timing error variance for longitudinal recording. FIG. 6 shows a comparison of timing error variance for perpendicular recording. The normalized timing error variance is defined as $$E\|\tau_n-\hat{\tau}_n\|^2/T^2$$

where $E[\cdot]$ denotes the expectation over n as well as the ensemble. These values are obtained by processing sectors that do not have cycle slips. Clearly, the ML method yields a better estimate of the timing phase and hence a lower error variance for each SNR. FIG. 7 shows a comparison of CSR for longitudinal recording. FIG. 8 shows a comparison of CSR for perpendicular recording. All these plots were obtained by simulating over 1000 sectors (each consisting of 4096 data bits and 100 preamble bits) at each SNR.

We now consider the performance of the ML timing recovery algorithm in the presence of jitter noise. We consider two cases: transition noise values of 50% and 90% in terms of the effective noise power, i.e.

$$M_0=\alpha(M_0+N_0)$$

where $\alpha=0.5$ and $\alpha=0.9$. The remaining system parameters are kept the same as in the previous case.

Figure 9:
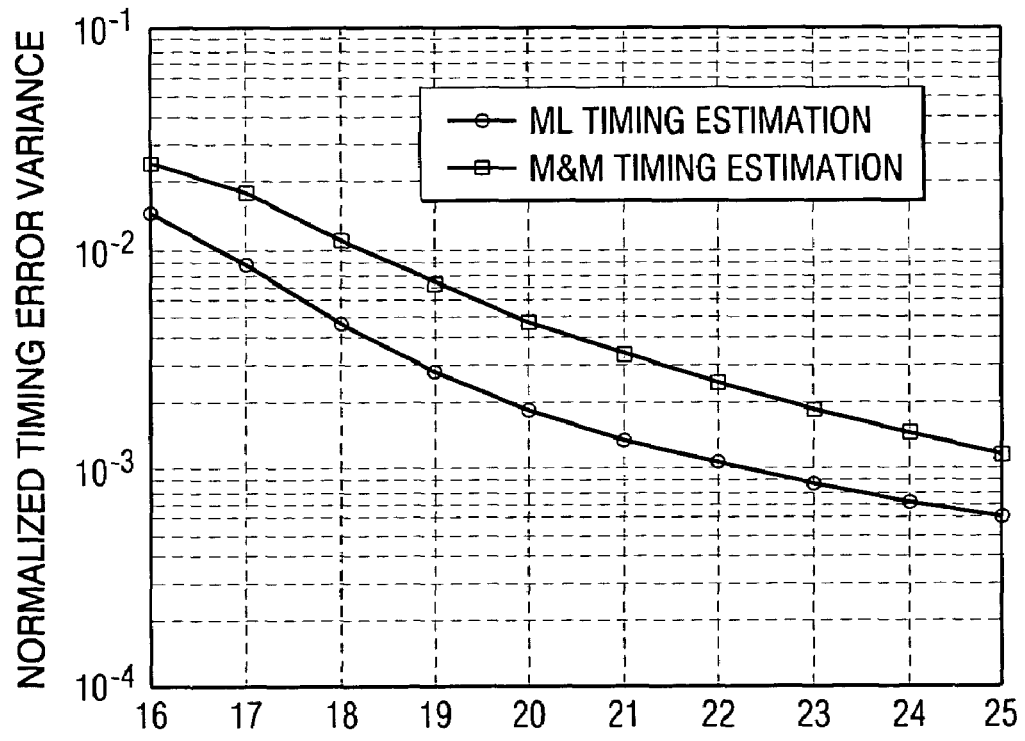
FIG. 9 is a graph showing a comparison of timing error variance for perpendicular recording with 50% transition noise.
Figure 10:
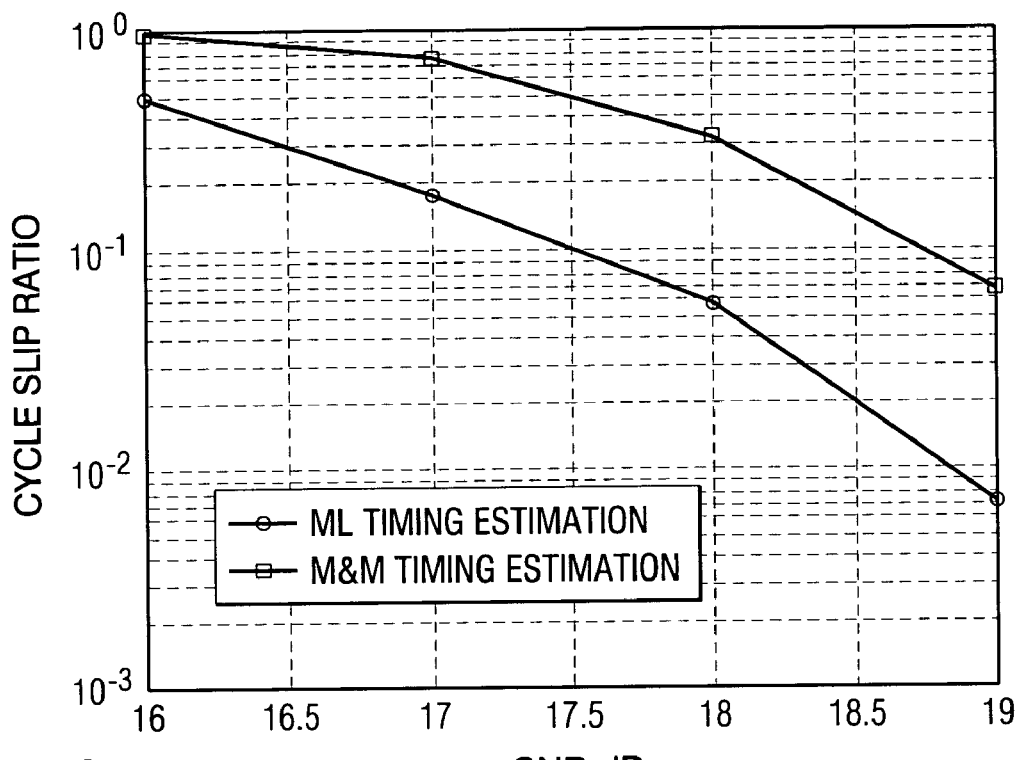
FIG. 10 is a graph showing a comparison of CSR for perpendicular recording with 50% transition noise.
Figure 11:
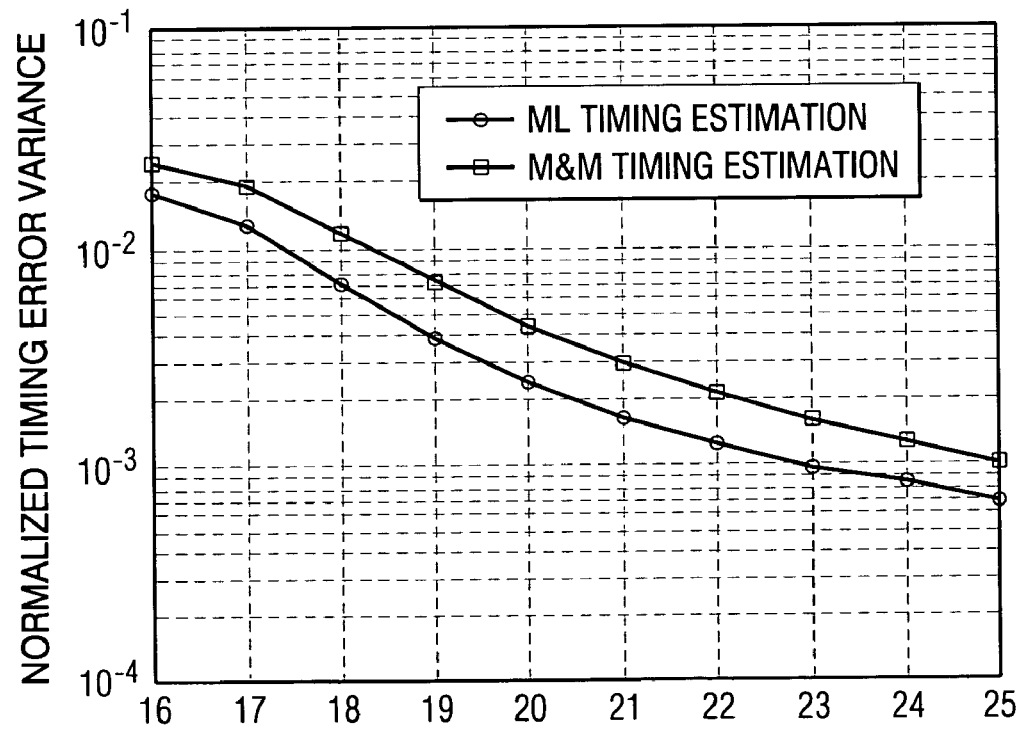
FIG. 11 is a graph showing a comparison of timing error variance for perpendicular recording with 90% transition noise.
Figure 12:
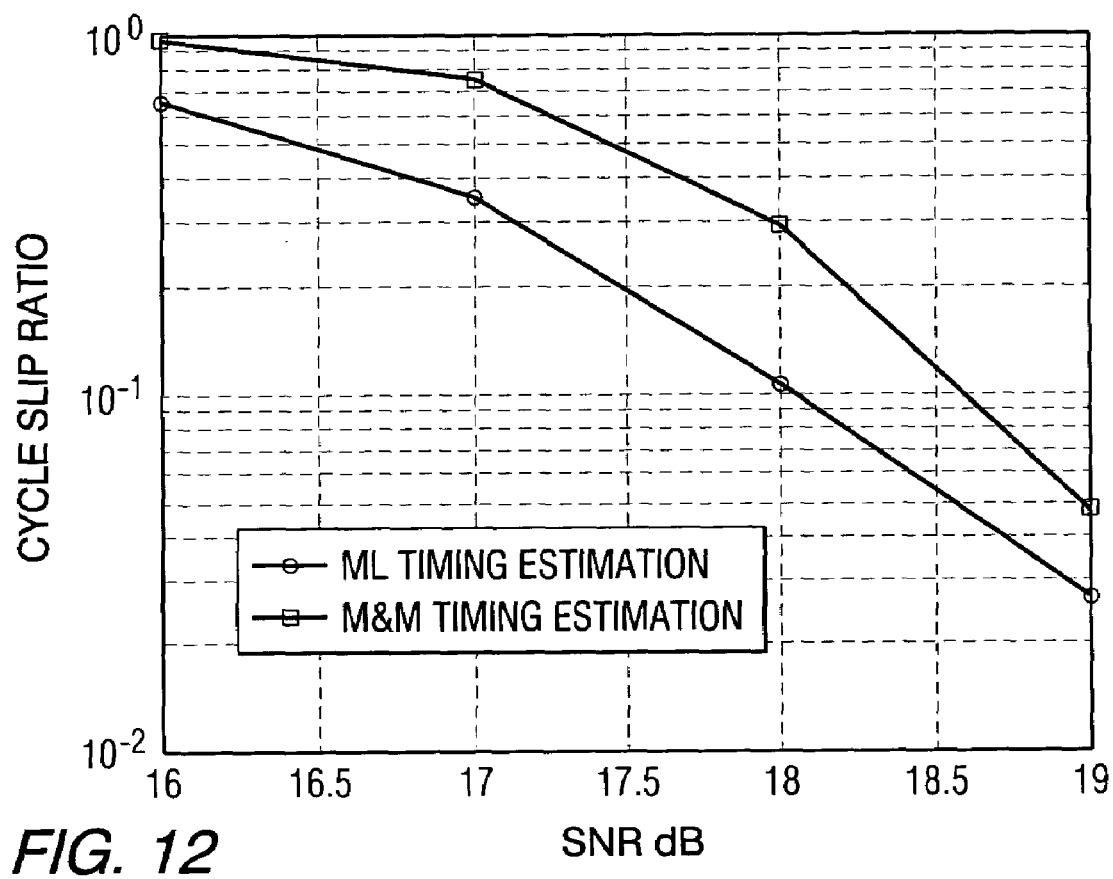
FIG. 12 is a graph showing a comparison of CSR for perpendicular recording with 90% transition noise.

FIG. 9 shows a comparison of timing error variance for perpendicular recording with 50% transition noise. FIG. 10 shows a comparison of CSR for perpendicular recording with 50% transition noise. FIG. 11 shows a comparison of timing error variance for perpendicular recording with 90% transition noise. FIG. 12 shows a comparison of CSR for perpendicular recording with 90% transition noise. From the data in these figures, it is apparent that the ML algorithm works well for the channel with transition noise even though it was not specifically designed for this case. Once again, the ML method outperforms the conventional method. There are similar gains for longitudinal recording as well.

From a practical standpoint, it is desirable to eliminate the VCO in the timing recovery system completely. This is because a fully digital implementation is easier to build. A solution to this problem in the context of conventional timing recover is to use an A/D sampler triggered by a free-running clock and an interpolator to predict the samples.

Figure 13:
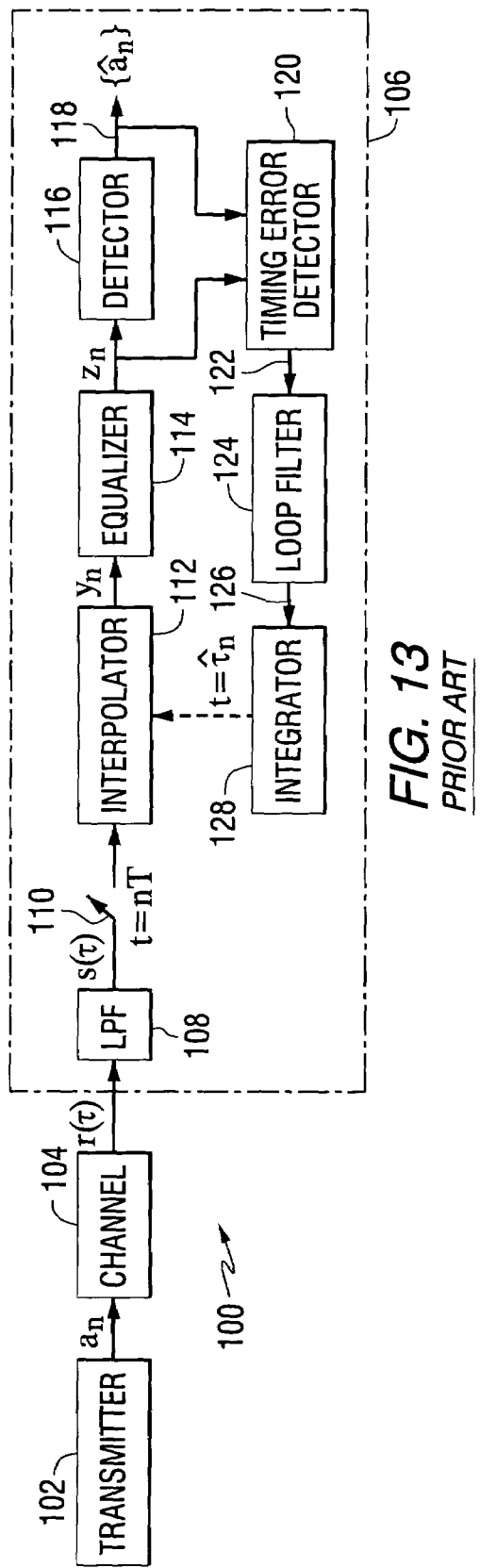
FIG. 13 is a block diagram of a conventional communications system including interpolated timing recovery.

FIG. 13 is a block diagram of a conventional communications system 100 including interpolated timing recovery. A transmitter 102 produces signals $a_n$ that are transmitted over a channel 104 to a receiver 106. The transmitted signals may be subject to noise or interference, resulting in signals $r(\tau)$ being received at the receiver. The receiver includes a front end circuit 108 that can include a low pass filter, which produces a filtered signal $s(\tau)$. A sampler, illustrated as a switch 110 samples the filtered signal using a free-running clock. The samples are interpolated by interpolator 112 to produce a plurality of samples $y_n$ that form a digital representation of the filtered signal. An equalizer 114 equalizes the samples to produce a plurality of equalized samples $z_n$. A detector 116, which can be, for example, a Viterbi detector, processes the equalized samples to produce estimates $â_n$ of the samples on line 118. A timing error detector 120 receives the equalized samples $z_n$ and the estimates $â_n$, and subjects these signals to an algorithm, such as the MM algorithm, to produce a timing error signal on line 122. The timing error signal passes through a loop filter 124 and the resulting filtered timing error signal on line 126 is integrated by integrator 128, which controls the interpolator.

The sampler uses a free-running clock to obtain samples of the filtered readback waveform at its Nyquist frequency. The job of the interpolator is to compute value of the readback waveform at other sampling instants. The rest of the timing recovery is essentially equivalent to the conventional approach of FIG. 1.

Figure 14:
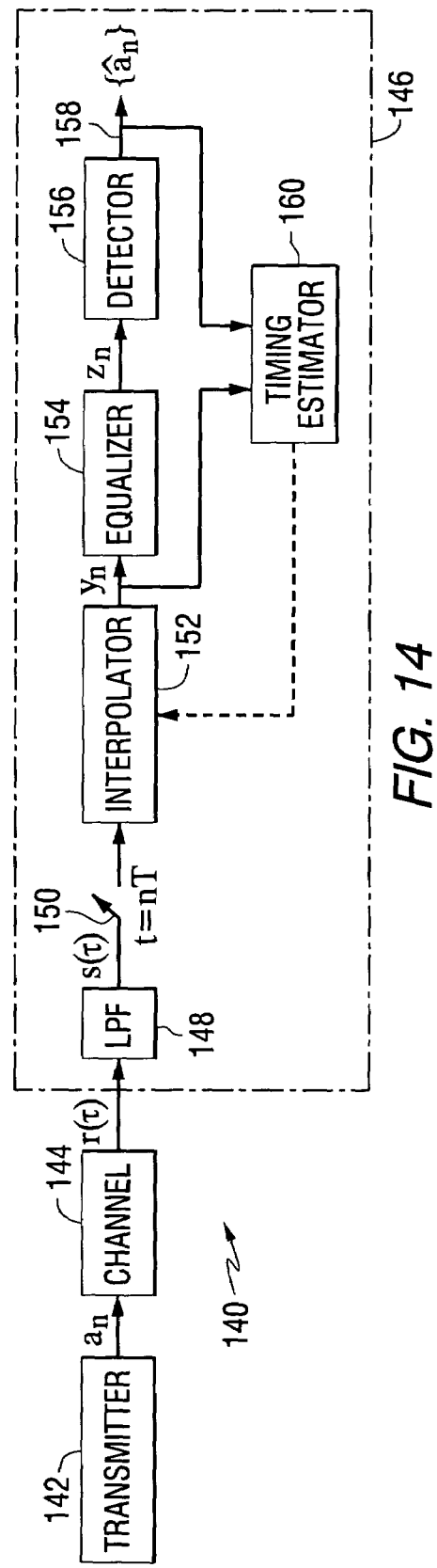
FIG. 14 is a block diagram of a communications system constructed in accordance with the present invention including interpolated timing recovery.

Another embodiment of the present invention uses ML timing recovery in a VCO-free implementation. FIG. 14 is a block diagram of a communications system 140 constructed in accordance with the invention and including interpolated timing recovery. A transmitter 142 produces signals $a_n$ that are transmitted over a channel 144 to a receiver 146. The transmitted signals may be subject to noise or interference, resulting in signals $r(\tau)$ being received at the receiver. The receiver includes a front end circuit 148 that can include a low pass filter, which produces a filtered signal $s(\tau)$. A sampler, illustrated as a switch 150, samples the filtered signal using a free-running clock. The samples are interpolated by interpolator 152 to produce a plurality of samples $y_n$ that form a digital representation of the filtered signal. An equalizer 154 equalizes the samples to produce a plurality of equalized samples $z_n$. A detector 156, which can be, for example, a Viterbi detector, processes the equalized samples to produce estimates $â_n$ of the samples on line 158. A timing error detector 160 receives the plurality of samples $y_n$ and the estimates $â_n$, and subjects these signals to an algorithm, to produce a timing error signal. The timing error signal is used to control the interpolator.

In a variant of the system of FIG. 14, the system of FIG. 14 can be modified to used $z_n$ and $â_n$ as the inputs of the timing estimator. This method does not require knowledge of the dibit response. Hence it is more attractive from a practical viewpoint.

Another possibility is to use the ML estimation algorithm in conjunction with persurvivor processing (PSP). In the conventional PSP based approach, the timing error detector computes an error signal for each surviving path in the trellis of the Viterbi detector. This reduces the loop delay by D bits caused by the Viterbi detector. This method owes its improved performance to its smaller loop delay but has a larger implementation complexity. The present invention can utilize an ML-PSP method with the ML estimator in place of the MM detector and the loop filter.

This invention allows for realistic changes in the clock phase and frequency caused by mechanical imperfections in the magnetic storage device such as spindle speed variation. The channel and clock models were used to derive expressions for the optimal timing information from the readback samples. These estimates for the sampling instants are optimal in the maximum-likelihood sense. These estimates also coincide with the minimum mean square sense asymptotically. The above description shows that the estimates can be implemented efficiently using a recursive method and a simple algorithm. Simulation results show that this method performs better than a conventional timing recovery scheme in terms of both steady state timing error variance and cycle slip rates.

In one embodiment, this invention provides a timing recovery scheme based on maximum-likelihood (ML) estimation in which several functional blocks of a conventional timing recovery system are combined into one block and optimized. In order to solve the problem analytically, the ML estimation is transformed into a Gaussian estimation problem by linearization using Taylor series expansions. A cost efficient solution to the linearized problem is obtained by exploiting the Markov chain relationship between the random variables in the problem. The computations of the ML timing estimate and its error covariance matrix are done recursively using their previous estimates and the convergence of the recursive algorithm parameters is robust to their initial values. The method is not limited to longitudinal and perpendicular modes of magnetic recording, but is also applicable to other recording architectures or communication systems.

The method of this invention can be implemented in the read channel of a magnetic storage device or in receivers of communications systems, using conventional hardware, such as electronic filters, oscillators and signal processors.

While the invention has been described in terms of several examples, it will be apparent to those skilled in the art that various changes can be made to the described examples without departing from the invention as set forth in the following claims.

What is claimed is:

1. A method of timing recovery comprising:
   receiving an input signal;
   sampling the input signal to produce a plurality of signal samples;
   detecting the samples to produce an output signal;
   estimating a timing phase offset with respect to ideal sampling instants described by a second order random walk model;
   estimating a timing frequency offset with respect to a local clock frequency described by the second order random walk model;
   using the estimation of the timing phase offset and the estimate of the timing frequency offset to obtain a maximum likelihood estimate of timing error between an actual sampling time instant and a desired sampling time instant; and
   controlling timing of the sampling in response to the estimation of the maximum likelihood estimate of the timing error includes persurvivor processing, wherein the step of controlling timing of the sampling in response to the estimation of the timing error includes:
   specifying a covariance matrix representative of uncertainty in the sample timing; and
   updating the covariant matrix for each maximum-likelihood estimation of timing error.

2. The method of claim 1, wherein the step of controlling timing of the sampling in response to the estimation of the timing error uses the signal samples and the output signal.

3. The method of claim 1, wherein the step of controlling timing of the sampling in response to the estimation of the timing error uses equalized signal samples and the output signal.

4. The method of claim 1, wherein the step of controlling timing of the sampling in response to the estimation of the timing error uses only a last signal sample and a last output signal.

5. An apparatus comprising:
an input for receiving an input signal;
a sampler for sampling the input signal to produce a plurality of signal samples;
a detector for detecting the samples to produce an output signal; and
a timing estimator for controlling timing of the sampling using a maximum-likelihood estimation of a timing phase offset and a maximum-likelihood estimation of a timing frequency offset to estimate timing error between an actual sampling time instant and a desired sampling time instant, wherein the timing phase offset is estimated with respect to ideal sampling instants described by a second order random walk model and the timing frequency offset is estimated with respect to a local clock frequency described by the second order random walk model, and wherein the timing estimator includes persurvivor processing, specifies a covariance matrix representative of uncertainty in the sample timing, and updates the covariant matrix for each maximum-likelihood estimation of timing error.

6. The apparatus of claim 5, wherein the timing estimator uses the signal samples and the output signal.

7. The apparatus of claim 5, wherein the timing estimator uses equalized signal samples and the output signal.

8. The apparatus of claim 5, wherein the timing estimator uses only a last signal sample and a last output signal.

9. A method of timing recovery comprising:
receiving an input signal;
sampling the input signal using a free-running clock to produce a plurality of signal samples;
interpolating the signal samples to produce interpolated samples;
detecting the interpolated samples to produce an output signal; and
controlling interpolation of the signal samples using a maximum-likelihood estimation of a timing phase offset and a maximum-likelihood estimation of a timing frequency offset to estimate timing error between an actual sampling time instant and a desired sampling time instant includes persurvivor processing, wherein the timing phase offset is estimated with respect to ideal sampling instants described by a second order random walk model and the timing frequency offset is estimated with respect to a local clock frequency described by the second order random walk model, and wherein the step of controlling interpolation of the signal samples using a maximum-likelihood estimation of the timing phase offset and a maximum-likelihood estimation of the timing frequency offset to estimate timing error between an actual sampling time instant and a desired sampling time instant includes:
specifying a covariance matrix representative of uncertainty in the sample timing; and
updating the covariant matrix for each maximum-likelihood estimation of timing error.

10. The method of claim 9, wherein the step of controlling interpolation of the signal samples using a maximum-likelihood estimation of the timing phase offset and a maximum-likelihood estimation of the timing frequency offset to estimate timing error between an actual sampling time instant and a desired sampling time instant uses the signal samples and the output signal.

11. The method of claim 9, wherein the step of controlling interpolation of the signal samples using a maximum-likelihood estimation of the timing phase offset and a maximum-likelihood estimation of the timing frequency offset to estimate timing error between an actual sampling time instant and a desired sampling time instant uses equalized signal samples and the output signal.

12. The method of claim 9, wherein the step of controlling interpolation of the signal samples using a maximum-likelihood estimation of the timing phase offset and a maximum-likelihood estimation of the timing frequency offset to estimate timing error between an actual sampling time instant and a desired sampling time instant uses only a last signal sample and a last output signal.

13. An apparatus comprising:
an input for receiving an input signal;
a sampler for sampling the input signal using a free-running clock to produce a plurality of signal samples;
an interpolator for interpolating the signal samples to produce interpolated samples;
a detector for detecting the interpolated samples to produce an output signal; and
a timing estimator for controlling interpolation of the signal samples using a maximum-likelihood estimation of a timing phase offset and a maximum-likelihood estimation of a timing frequency offset to estimate timing error between an actual sampling time instant and a desired sampling time instant, wherein the timing phase offset is estimated with respect to ideal sampling instants described by a second order random walk model and the timing frequency offset is estimated with respect to a local clock frequency described by the second order random walk model, and wherein the timing estimator includes persurvivor processing, specifies a covariance matrix representative of uncertainty in the sample timing, and updates the covariant matrix for each maximum-likelihood estimation of timing error.

14. The apparatus of claim 13, wherein the timing estimator uses the signal samples and the output signal.

15. The apparatus of claim 13, wherein the timing estimator uses equalized signal samples and the output signal.

16. The apparatus of claim 13, wherein the timing estimator uses only a last signal sample and a last output signal.

* * * * *